United States Patent
Song et al.

(10) Patent No.: US 10,665,575 B2
(45) Date of Patent: May 26, 2020

(54) SEMICONDUCTOR PACKAGE

(71) Applicant: SAMSUNG ELECTRONICS CO., LTD., Suwon-si (KR)

(72) Inventors: Eun-seok Song, Hwaseong-si (KR); Chan-kyung Kim, Hwaseong-si (KR); Tae-joo Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/585,123

(22) Filed: Sep. 27, 2019

(65) Prior Publication Data

US 2020/0027862 A1    Jan. 23, 2020

Related U.S. Application Data

(63) Continuation of application No. 16/134,583, filed on Sep. 18, 2018, now Pat. No. 10,475,774.

(30) Foreign Application Priority Data

Feb. 22, 2018   (KR) .................. 10-2018-0021200

(51) Int. Cl.
*H01L 23/495*   (2006.01)
*H01L 25/10*   (2006.01)
*H01L 23/498*   (2006.01)
*G11C 5/06*   (2006.01)
(Continued)

(52) U.S. Cl.
CPC .............. *H01L 25/105* (2013.01); *G11C 5/04* (2013.01); *G11C 5/06* (2013.01); *H01L 23/49816* (2013.01); *H01L 23/49822* (2013.01); *H01L 23/49827* (2013.01); *H01L 24/04* (2013.01); *H01L 24/13* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/0401* (2013.01); *H01L 2224/04042* (2013.01); *H01L 2224/13101* (2013.01); *H01L 2224/13111* (2013.01);
(Continued)

(58) Field of Classification Search
CPC ......... H01L 23/49816; H01L 23/49822; H01L 23/49827; G11C 55/06; G11C 5/14
USPC .......................................................... 257/688
See application file for complete search history.

(56) References Cited

U.S. PATENT DOCUMENTS 7,800,212 B2   9/2010   Yoon et al.
8,975,726 B2   3/2015   Chen et al.
(Continued)

FOREIGN PATENT DOCUMENTS

KR   10-2016-0015619 A   2/2016

*Primary Examiner* — David S Blum
(74) *Attorney, Agent, or Firm* — Sughrue Mion, PLLC (57) ABSTRACT

A semiconductor package includes: a memory sub-package including a first connecting layer and a plurality of memory chips disposed on the first connecting layer; a logic sub-package including a second connecting layer, a controller chip disposed on the second connecting layer, and a buffer chip connected to the controller chip and the plurality of memory chips; and a plurality of inter-package connecting members each of which connects the memory sub-package and the logic sub-package, wherein the buffer chip is connected to the plurality of memory chips via a plurality of first data transfer lines each having a first data transfer rate, the buffer chip is connected to the controller chip via a plurality of second data transfer lines each having a second data transfer rate, and the first data transfer rate is less than the second data transfer rate.

20 Claims, 6 Drawing Sheets

(51) Int. Cl.
*G11C 5/04* (2006.01)
*H01L 23/00* (2006.01)

(52) U.S. Cl.
CPC ............ *H01L 2224/13116* (2013.01); *H01L 2224/13144* (2013.01); *H01L 2224/13147* (2013.01); *H01L 2224/13155* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73215* (2013.01); *H01L 2224/73265* (2013.01); *H01L 2224/92125* (2013.01); *H01L 2225/1058* (2013.01); *H01L 2924/00014* (2013.01); *H01L 2924/1431* (2013.01); *H01L 2924/1434* (2013.01); *H01L 2924/15174* (2013.01); *H01L 2924/15192* (2013.01); *H01L 2924/15311* (2013.01); *H01L 2924/181* (2013.01)

(56) References Cited

U.S. PATENT DOCUMENTS

| | | | |
|---|---|---|---|
| 9,093,392 | B2 | 7/2015 | Cho et al. |
| 9,117,035 | B2 | 8/2015 | Shaeffer et al. |
| 9,431,374 | B2 | 8/2016 | Lee et al. |
| 9,548,289 | B2 | 1/2017 | Lin et al. |
| 9,564,411 | B2 | 2/2017 | Park et al. |
| 9,576,926 | B2 | 2/2017 | Yu et al. |
| 9,589,936 | B2 | 3/2017 | Zhai et al. |
| 9,613,931 | B2 | 4/2017 | Lin et al. |
| 9,633,974 | B2 | 4/2017 | Zhai et al. |
| 9,653,442 | B2 | 5/2017 | Yu et al. |
| 9,691,686 | B2 | 6/2017 | Huang et al. |
| 9,793,217 | B2 | 10/2017 | Lee et al. |
| 2016/0036425 | A1 | 2/2016 | Ko |
| 2016/0071820 | A1 | 3/2016 | Yu et al. |
| 2016/0240480 | A1 | 8/2016 | Lin et al. |
| 2016/0322336 | A1 | 11/2016 | Tu et al. |
| 2017/0068633 | A1 | 3/2017 | Kwon |
| 2017/0263518 | A1 | 9/2017 | Yu et al. |

SEMICONDUCTOR PACKAGE

CROSS-REFERENCE TO THE RELATED APPLICATIONS

This application is a Continuation of U.S. application Ser. No. 16/134,583, now U.S. Pat. No. 10,475,774, filed Sep. 18, 2018, which claims priority from Korean Patent Application No. 10-2018-0021200, filed on Feb. 22, 2018, in the Korean Intellectual Property Office, the disclosures of which are incorporated herein in their entirety by reference.

BACKGROUND

The inventive concept relates to a semiconductor package, and more particularly, to a semiconductor package of a package on package (PoP) type.

There is a growing demand for semiconductor packages capable of implementing systems having a high memory bandwidth. A memory bandwidth is proportional to data transfer rate and the number of data transfer lines. To increase the memory bandwidth, either memory operation speed or the number of data transfer lines may be increased. However, development of a new memory chip having an improved operation speed may have difficulties in a manufacturing process, and may take a lot of time and cost. In addition, increasing the number of data transfer lines may increase the number of data transmission pins of a semiconductor chip, and may increase a planar area of the semiconductor chip.

SUMMARY

The inventive concept provides a semiconductor package having a high memory bandwidth.

According to an aspect of the inventive concept, there is provided a semiconductor package including: a memory sub-package including a first connecting layer and a plurality of memory chips disposed on the first connecting layer; a logic sub-package including a second connecting layer, a controller chip disposed on the second connecting layer, and a buffer chip connected to the controller chip and the plurality of memory chips; and a plurality of inter-package connecting members each of which connects the memory sub-package and the logic sub-package, wherein the buffer chip is connected to the plurality of memory chips via a plurality of first data transfer lines each having a first data transfer rate, the buffer chip is connected to the controller chip via a plurality of second data transfer lines each having a second data transfer rate, and the first data transfer rate is less than the second data transfer rate.

According to another aspect of the inventive concept, there is provided a semiconductor package including: a first connecting layer including a first insulating layer and a plurality of first conductive patterns; a second connecting layer disposed below the first connecting layer, the second connecting layer including a second insulating layer and a second conductive pattern; a third connecting layer disposed between the first connecting layer and the second connecting layer, the third connecting layer including a third insulating layer and a plurality of a third conductive pattern; a plurality of inter-package connecting members each of which connects the third connecting layer and the first connecting layer; a plurality of inter-package connecting member each of which extends between the third connecting layer and the second connecting layer; a plurality of memory chips over the first connecting layer, a controller chip over the second connecting layer; and a buffer chip over the third connecting layer, wherein the buffer chip is connected to the plurality of memory chips via a plurality of first data transfer lines each having a first data transfer rate, the buffer chip is connected to the controller chip via a plurality of second data transfer lines each having a second data transfer rate, and the first data transfer rate is less than the second data transfer rate.

According to another aspect of the inventive concept, there is provided a semiconductor package including: a memory bus-package including a first insulating layer and a plurality of memory chips disposed on the first connecting layer; a logic sub-package including a second connecting layer, a controller chip over the second connecting layer, and a first buffer chip and a second buffer chip connected to the controller chip and the memory sub-package; a plurality of inter-package connecting members each of which connects the memory sub-package and the logic sub-package, and a plurality of external connecting members disposed beneath the second connecting layer, wherein the number of first data transfer lines between the first buffer chip and the memory sub-package is greater than the number of second data transfer lines between the first buffer chip and the controller chip, and the number of third data transfer lines between the second buffer chip and the memory sub-package is greater than the number of fourth data transfer lines between the second buffer chip and the controller chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

It will be understood that when an element or layer is referred to as being "over," "above," "on," "below," "beneath," "connected to" or "coupled to" another element or layer, it can be directly over, above, on, below, beneath, connected or coupled to the other element or layer or intervening elements or layers may be present. In contrast, when an element is referred to as being "directly over," "directly above," "directly on," "directly below," "directly beneath," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
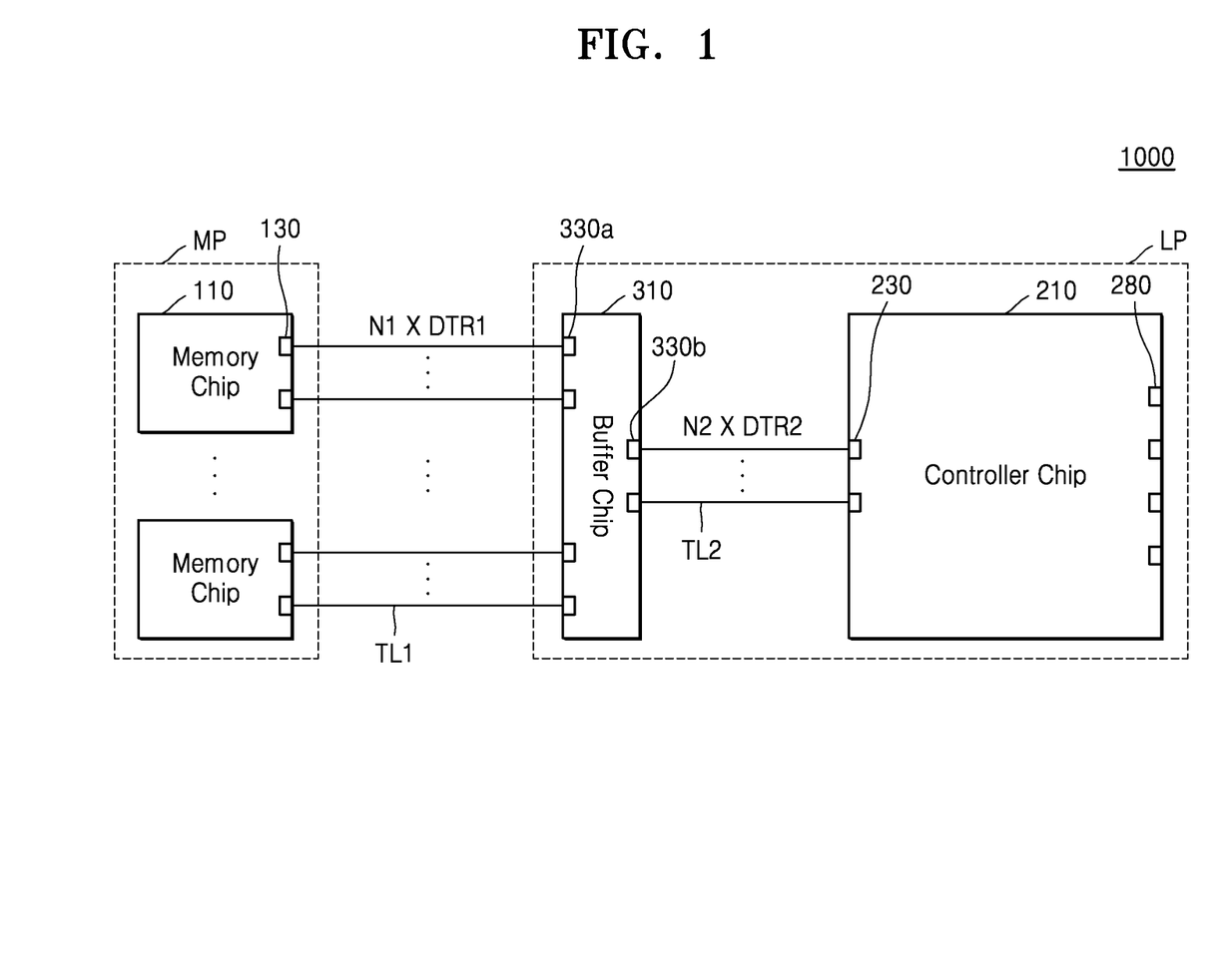
FIG. 1 is a block diagram illustrating a semiconductor package according to an exemplary embodiment.

FIG. 1 is a block diagram illustrating a semiconductor package 1000 according to an exemplary embodiment.

Referring to FIG. 1, the semiconductor package 1000 according to an exemplary embodiment may include a memory sub-package MP and a logic sub-package LP. The memory sub-package MP may include a plurality of memory chips 110. Each of the memory chips 110 may be configured to store data. Each of the memory chips 110 may include, for example, a dynamic random-access memory (DRAM) chip, a static RAM (SRAM) chip, a flash memory chip, an electrically erasable and programmable ROM (EEPROM) chip, a phase-change RAM (PRAM) chip, a magnetic RAM (MRAM) chip, or a resistive RAM (RRAM) chip The logic sub-package LP may include a controller chip 210 and a buffer chip 310. The controller chip 210 may include a memory controller configured to control an operation of the memory chip 110. Herein, the controller chip 210 may be a chip including only a memory controller or an arbitrary logic integrated chip including the memory controller as a portion thereof. For example, the controller chip 210 may be a central processing unit (CPU) chip, a graphics processing unit (GPU) chip, or an application processor (AP) chip including the memory controller.

The buffer chip 310 may be disposed between the plurality of memory chips 110 and the controller chip 210. The buffer chip 310 may serialize data signals received from the memory chip 110 and transfer the serialized data signals to the controller chip 210, and parallelize the data signals received from the controller chip 210 and transfer the parallelized data signals to the memory chip 110. In other words, the buffer chip 310 may include a serial-parallel conversion circuit.

A plurality of first data transfer lines TL1 may connect the buffer chip 310 to the plurality of memory chips 110, and a plurality of second data transfer lines TL2 may connect the buffer chip 310 to the controller chip 210. Although not illustrated in FIG. 1, another signal transfer line connecting between the plurality of memory chips 110 and the controller chip 210 may be further included in addition to the plurality of first data transfer lines TL1 and the plurality of second data transfer lines TL2. For example, an address transfer line to transfer an address signal and/or a command transfer line to transfer a command signal may connect the plurality of memory chips 110 and the controller chip 210. The address transfer line and/or the command transfer line may connect the plurality of memory chips 110 and the controller chip 210 via the buffer chip 310, or may directly connect the plurality of memory chips 110 and the controller chip 210 without via the buffer chip 310.

The memory chip 110, the controller chip 210, and the buffer chip 310 may have data transfer pins 130, data transfer pins 230, and first data transfer pins 330a and/or second data transfer pins 330b, respectively. A term 'pin' herein may refer to a pad which is formed on a surface of a semiconductor chip to connect an internal circuit of the semiconductor chip such as the memory chip 110, the controller chip 210, and the buffer chip 310 to a circuit outside the semiconductor chip. For example, each memory chip 110 may include a plurality of data transfer pins 130 to transfer data signals to the first data transfer line TL1. In addition, the buffer chip 310 may further include a plurality of first data transfer pins 330a to connect the buffer chip 310 to the first data transfer line TL1 and a plurality of second data transfer pins 330b to connect the buffer chip 310 to the second data transfer line TL2. In addition, the controller chip 210 may have a plurality of data transfer pins 230 to transfer data signals to the second data transfer line TL2. When the plurality of memory chips 110 are all connected in parallel to the buffer chip 310, the number N1 of the first data transfer lines TL1, a total number of data transfer pins 130 included in the plurality of memory chips 110, and the number of the first data transfer pins 330a of the buffer chip 310 may be the same. In addition, the number N2 of the second data transfer lines TL2, the number of the data transfer pins 230 of the controller chip 210, and the number of the second data transfer pins 330b of the buffer chip 310 may be the same.

Each of the memory chip 110, the controller chip 210, and the buffer chip 310 may include additional pins except the data transfer pins 130 and 230, and the first and second data transfer pins 330a and 330b. For example, the controller chip 210 may include a plurality of external connecting pins 280 to connect the controller chip 210 to a device outside the semiconductor package 1000. Although not illustrated in FIG. 1, each of the memory chip 110, the buffer chip 310, and the controller chip 210 may include an address transfer pin connected to the address transfer line, and/or a command transfer pin connected to the command transfer line.

Each first data transfer line TL1 may have a first data transfer rate DTR1 and each second data transfer line TL2 may have a second data transfer rate DTR2. The first data transfer rate DTR1 of the first data transfer line TL1 may be less than the second data transfer rate DTR2 of the second data transfer line TL2. In some exemplary embodiments, the second data transfer rate DTR2 may be an even multiple of the first data transfer rate DTR1. For example, the second data transfer rate DTR2 may be about two times, about four times, or about eight times the first data transfer rate DTR1.

The number N1 of the first data transfer lines TL1 may be greater than the number N2 of the second data transfer lines TL2. In some exemplary embodiments, the number N1 of the first data transfer lines TL1 may be an even multiple of the number N2 of the second data transfer lines TL2. For example, the number N1 of the first data transfer lines TL1 may be about two times, about four times, or about eight times the number N2 of the second data transfer lines TL2.

In some exemplary embodiments, a product of the first data transfer rate DTR1 and the number N1 of the first data transfer lines TL1 may be equal to a product of the second data transfer rate DTR2 and the number N2 of the second data transfer lines. For example, when the second data transfer rate DTR2 is about two times the first data transfer rate DTR1 and the number N1 of the first data transfer lines TL1 is about two times the number N2 of the second data transfer lines TL2, the product of the first data transfer rate DTR1 and the number N1 of the first data transfer lines TL1 may be substantially the same as the product of the second data transfer rate DTR2 and the number of the second data transfer lines TL2.

For example, the memory sub-package MP may include eight memory chips 110 each including 16 data transfer pins 130. The eight memory chips 110 may be connected to the buffer chip 310 via a total of 128 (that is, N1=16×8) first data transfer lines TL1, and the first data transfer rate DTR1 of each of the first data transfer lines TL1 may be about 4.266 gigabits per second (Gbps). The controller chip 210 may be connected to the buffer chip 310 via 64 (that is, N2=64) second data transfer lines TL2 and the second data transfer rate DTR2 of each of the second data transfer lines TL2 may be about 8.532 Gbps.

The buffer chip 310 may increase the bandwidth between the plurality of memory chips 110 and the buffer chips 310 by increasing relatively the number N1 of the first data transfer lines TL1 between the plurality of memory chips 110 and the buffer chip 310, while the buffer chip 310 may increase the bandwidth between the buffer chip 310 and the controller chip 210 by increasing relatively the second data transfer rate DTR2 between the buffer chip 310 and the controller chip 210. Thus, the semiconductor package 1000 according to an exemplary embodiment of the present inventive concept may achieve improved memory bandwidth by increasing the number of the memory chips 110 connected in parallel to the buffer chip 310 without developing the memory chips 110 to have faster speed, and by increasing the second data transfer rate DTR2 between the buffer chip 310 and the controller chip 210 without increasing the number of the data transfer pins 230 of the controller chip 210.

Figure 2:
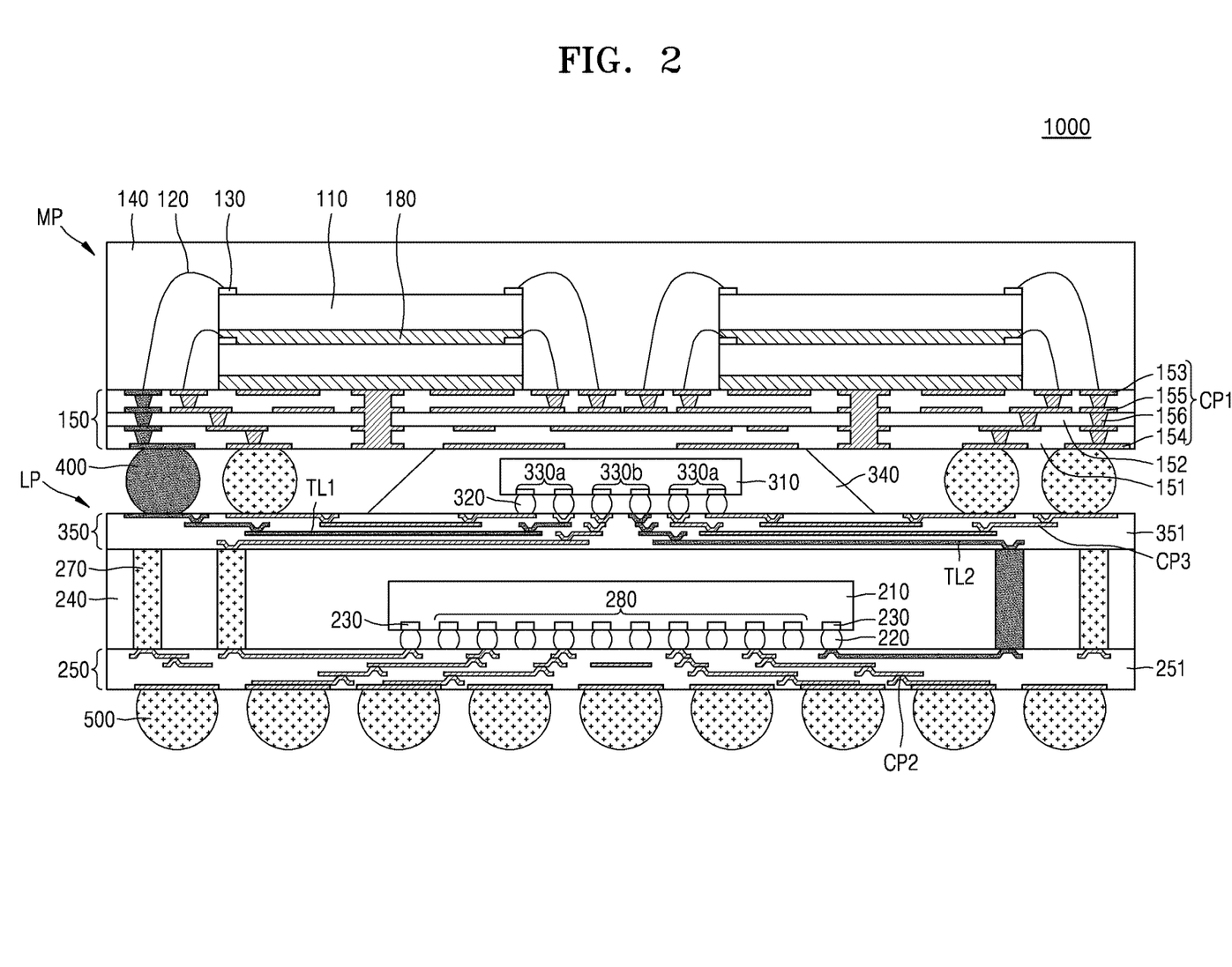
FIG. 2 is a cross-sectional view of a semiconductor package illustrated in FIG. 1, according to an exemplary embodiment.

FIG. 2 is a cross-sectional view of the semiconductor package 1000 illustrated in FIG. 1 according to an exemplary embodiment.

Referring to FIG. 2, the semiconductor package 1000 according to an exemplary embodiment may be of a package on package (PoP) type in which the memory sub-package MP and the logic sub-package LP are connected to each other. The memory sub-package MP may be disposed above the logic sub-package LP, and the memory sub-package MP and the logic sub-package LP may be connected by an inter-package connecting member 400.

The memory sub-package MP may include, for example, a first connecting layer 150, the plurality of memory chips 110, and a first molding member 140. The first connecting layer 150 may support the plurality of memory chips 110, and connect the memory chips 110 to other memory chips 110 and/or the inter-package connecting member 400. Although the first connecting layer 150 is illustrated as a printed circuit board (PCB) in FIG. 2, the exemplary embodiment is not limited thereto, and the first connecting layer 150 may be, for example, an interposer substrate, or a redistribution layer (RDL). The first connecting layer 150 may include a first insulating layer 151 and first conductive patterns CP1 in the first insulating layer 151. The first insulating layer 151 may include a plurality of layers. The first conductive patterns CP1 may also include a plurality of layers. The first conductive patterns CP1 may connect between the plurality of memory chips 110 and the inter-package connecting member 400. The first conductive patterns CP1 may include copper (Cu), nickel (Ni), or a combination thereof.

When the first connecting layer 150 is a PCB, the first connecting layer 150 may further include a core layer 152 on the first insulating layer 151. However, in some exemplary embodiments, the first connecting layer 150 may be a coreless PCB that does not include the core layer 152. The first insulating layer 151 and the core layer 152 of the first connecting layer 150 may include an epoxy resin, a polyester resin, or a polyimide resin, or a combination thereof. The first insulating layer 151 and the core layer 152 may include, for example, a glass fiber epoxy composite material. The first conductive patterns CP1 may include top pads 153 on a top surface of the first connecting layer 150, bottom pads 154 on a bottom surface of the first connecting layer 150, conductive lines 155 on multiple layers in the first connecting layer 150, and via 156 connecting the conductive lines 155 on different layers. The top pad 153 and the bottom pad 154 may be exposed by solder resist layers (not shown) covering a top surface and a bottom surface of the first insulating layer 151, respectively. The conductive lines 155 and the via 156 may connect the top pad 153 and the bottom pad 154.

When the first connecting layer 150 is an RDL, the first insulating layer 151 may include, for example, an organic insulating material such as polyimide (PI), polybenzoxazole (PBO), and benzocyclobutene (BCB), an inorganic insulating material such as silicon nitride, silicon oxynitride, and silicon oxide, or a combination thereof. When the first connecting layer 150 is an interposer substrate, the first insulating layer 151 may include, for example, silicon, ceramic, glass, an organic material, or a combination thereof. Although the first connecting layer 150 is illustrated as consisting of three layers in FIG. 2, it is only exemplary and may include a different number of layers.

The plurality of memory chips 110 may be stacked on the first connecting layer 150 to form at least one stacked structure. Although a total of four memory chips 110 are illustrated as two stacked structures in FIG. 2, the number of memory chips 110 included in the memory sub-package MP and the number of the stacked structures formed by the memory chips 110 are not limited thereto. In some exemplary embodiments, the plurality of memory chips 110 may not be stacked above the first connecting layer 150 but may be disposed side-by-side on the first connecting layer 150.

A chip bonding layer 180 to fix each memory chip 110 onto another memory chip 110 and/or the first connecting layer 150 may be disposed on a bottom surface of each memory chip 110. The chip bonding layer 180 may include a thermosetting resin, a thermoplastic resin, an ultra-violet (UV) curable resin, or a combination thereof. The chip bonding layer 180 may include, for example, an epoxy resin, a urethane resin, an acrylic resin, or a combination thereof.

In some exemplary embodiments, the plurality of memory chips 110 may be connected to the first conductive patterns CP1 of the first connecting layer 150 via first chip connecting members 120 that are optional and in contact with the data transfer pins 130 of the memory chips 110. Although the data transfer pin 130 of the memory chip 110 is illustrated as being connected to the first conductive pattern CP1 of the first connecting layer 150 via a wire as the first chip connecting members 120 in a wire bonding manner, the technical idea of the present inventive concept is not limited thereto. For example, the data transfer pins 130 of the memory chip 110 may be connected to the first conductive patterns CP1 of the first connecting layer 150 via bumps as the first chip connecting members 120 in a flip chip bonding manner.

The first molding member 140 may cover the top surface of the first connecting layer 150 and surround the plurality of memory chips 110 and the first chip connecting members 120. The first molding member 140 may include a thermosetting resin, a thermoplastic resin, a UV curable resin, or a combination thereof. The first molding member 140 may include, for example, an epoxy resin, a silicone resin, or a combination thereof. The first molding member 140 may include, for example, an epoxy mold compound (EMC).

The logic sub-package LP may include a second connecting layer 250, the controller chip 210, a third connecting layer 350, an inter-layer connecting member 270, a second molding member 240, and the buffer chip 310. In some exemplary embodiments, the logic sub-package LP may be of a fan-out package type. For example, the logic sub-package LP may be of a fan-out wafer level package (FOWLP) type or a fan-out panel level package (FOPLP) type.

The second connecting layer 250 may support the controller chip 210, and connect the controller chip 210 to an external connecting member 500 and the inter-layer connecting member 270. In FIG. 2, the second connecting layer 250 is illustrated as an RDL. However, in some exemplary embodiments, the second connecting layer 250 may be a PCB, or an interposer substrate. The second connecting layer 250 may include a second insulating layer 251 and second conductive patterns CP2 in the second insulating layer 251. Some of the second conductive patterns CP2 may connect the controller chip 210 and the inter-layer connecting member 270. Some other second conductive patterns CP2 may connect the controller chip 210 and the external connecting member 500. Materials forming the second insulating layer 251 and the second conductive patterns CP2 may be identical to the materials forming the first insulating layer 151 and the first conductive patterns CP1, and thus, duplicate descriptions are omitted.

The controller chip 210 may be disposed on the second connecting layer 250. In FIG. 2, the data transfer pins 230 of the controller chip 210 are illustrated to be at a periphery of the controller chip 210 and the external connecting pins 280 of the controller chip 210 are illustrated to be at a center portion of the controller chip 210, but a relative disposition of the data transfer pins 230 and the external connecting pins 280 inside the controller chip 210 may be variously modified.

In some exemplary embodiments, the controller chip 210 and the second connecting layer 250 may be connected via a second chip connecting member 220 therebetween. The second chip connecting members 220 may be in contact with the data transfer pins 230 and/or the external connecting pins 280 of the controller chip 210 and the second conductive patterns CP2 of the second connecting layer 250. The second chip connecting member 220 may include a conductive material. The second chip connecting member 220 may include, for example, Au, Cu, Ni, Sn, Pb, or a combination thereof. The second chip connecting member 220 may have any shape including a pillar shape or a ball shape. The second chip connecting member 220 may be formed from, for example, a solder ball or a copper micro-pillar, but is not limited thereto. In addition, in some exemplary embodiments, an under-fill (not shown) may fill a space between the controller chip 210 and the second connecting layer 250 and surround the second chip connecting member 220. In some exemplary embodiments, unlike as illustrated in FIG. 2, the controller chip 210 and the second connecting layer 250 may be connected directly to each other without through the second chip connecting member 220. In other words, the data transfer pins 230 and/or the external connecting pins 280 of the controller chip 210 may directly contact the second conductive patterns CP2 of the second connecting layer 250.

The third connecting layer 350 may be disposed above the controller chip 210. The third connecting layer 350 may support the buffer chip, 310 and may connect the buffer chip 310 to the inter-package connecting member 400 and the inter-layer connecting member 270. In FIG. 2, the third connecting layer 350 is illustrated as an RDL. However, in some exemplary embodiments, the third connecting layer 350 may be a PCB, or an interposer substrate. The third connecting layer 350 may include the third insulation layer 351 and third conductive patterns CP3 in the third insulating layer 351. Some of the third conductive patterns CP3 may connect the buffer chip 310 and the inter-layer connecting member 270. Some of the third conductive patterns CP3 may connect the buffer chip 310 and the inter-package connecting member 400. Materials forming the third insulating layer 351 and the third conductive patterns CP3 may be identical to the materials forming the first insulating layer 151 and the first conductive patterns CP1, and thus duplicate descriptions are omitted.

The buffer chip 310 may be disposed above the third connecting layer 350. In some exemplary embodiments, the buffer chip 310 may be spaced apart from the first connecting layer 150. In FIG. 2, the first data transfer pins 330a of the buffer chip 310 are illustrated to be at a periphery of the buffer chip 310 and the second data transfer pins 330b of the buffer chip 310 are illustrated to be at a center portion of the buffer chip 310, but a relative disposition of the first data transfer pins 330a and the second data transfer pins 330b inside the buffer chip 310 may be variously modified. The buffer chip 310 may be disposed above a top surface of the third connecting layer 350 as illustrated in FIG. 2, or may be disposed on a bottom surface of the third connecting layer 350, unlike as illustrated in FIG. 2.

In some exemplary embodiments, the buffer chip 310 and the third connecting layer 350 may be connected to each other via a third chip connecting member 320 therebetween. The third chip connecting members 320 may be in contact with the first data transfer pins 330a and/or the second data transfer pins 330b of the buffer chip 310, and the third conductive patterns CP3 of the third connecting layer 350. Materials forming the third chip connecting member 320 may be identical to the material forming the second chip connecting member 220, and thus, duplicate descriptions are omitted. In addition, in some exemplary embodiments, an under-fill (not shown) may fill a space between the buffer chip 310 and the third connecting layer 350, and may surround the third chip connecting member 320. In some exemplary embodiments, unlike as illustrated in FIG. 2, the buffer chip 310 and the third connecting layer 350 may be connected directly to each other without through the third chip connecting member 320. In other words, the first data transfer pins 330a and/or the second data transfer pins 330b of the buffer chip 310 may directly contact the third conductive patterns CP3 of the third connecting layer 350.

The inter-layer connecting member 270 may extend between the second connecting layer 250 and the third connecting layer 350 to connect the second connecting layer 250 to the third connecting layer 350. The inter-layer connecting member 270 may include a conductive material. The inter-layer connecting member 270 may include, for example, Au, Cu, Ni, or a combination thereof. The inter-layer connecting member 270 may be, for example, a copper pillar, but is not limited thereto. The inter-layer connecting member 270 may have any shape including a columnar shape and a ball shape.

The second molding member 240 may cover a top surface of the second connecting layer 250 and surround the controller chip 210. The second molding member 240 may fill at least some of a space between the second connecting layer 250 and the third connecting layer 350. The second molding member 240 may completely cover the inter-layer connecting member 270 as illustrated in FIG. 2 or, unlike as illustrated in FIG. 2, may expose the inter-layer connecting member 270. Materials forming the second molding member 240 may be identical to the materials forming the first molding member 140, and thus, duplicate descriptions are omitted.

In some exemplary embodiments, the semiconductor package 1000 may further include a third molding member 340 surrounding the buffer chip 310. The third molding member 340 may fill at least some of a space between the memory sub-package MP and the logic sub-package LP. In other words, the third molding member 340 may fill at least some of a space between the first connecting layer 150 of the memory sub-package MP and the third connecting layer 350 of the logic sub-package LP. The third molding member 340 may expose the inter-package connecting member 400 as illustrated in FIG. 2, or unlike as illustrated in FIG. 2, may completely cover the inter-package connecting member 400.

The inter-package connecting member 400 may be disposed between the memory sub-package MP and the logic sub-package LP. The inter-package connecting member 400 may be disposed between the first connecting layer 150 of the memory sub-package MP and the third connecting layer 350 of the logic sub-package LP. The inter-package connecting member 400 may include a conductive material. The inter-package connecting member 400 may include, for example, Au, Cu, Ni, Sn, Pb, or a combination thereof. The inter-package connecting member 400 may be formed from, for example, a solder ball, but is not limited thereto. The inter-package connecting member 400 may have any shape including a columnar shape, a ball shape, a shape in which two balls are vertically stacked, and the like.

The semiconductor package 1000 may further include the external connecting member 500 beneath a bottom surface of the second connecting layer 250. The external connecting member 500 may be connected to the controller chip 210 via the second conductive patterns CP2 of the second connecting layer 250. The external connecting member 500 may include, for example, Au, Cu, Ni, Sn, Pb, or a combination thereof. The external connecting member 500 may be formed from, for example, a solder ball.

In FIG. 2, one of the plurality of first data transfer lines TL1 and one of the plurality of second data transfer lines TL2 are illustrated as an example. The first data transfer line TL1 may include the first conductive pattern CP1 of the first connecting layer 150, the inter-package connecting member 400, and the third conductive pattern CP3 of the third connecting layer 350. The first data transfer line TL1 may not include the second conductive pattern CP2. In other words, the first data transfer line TL1 may not extend into the second insulating layer 251. The second data transfer line TL2 may include the third conductive pattern CP3 of the third connecting layer 350, the inter-layer connecting member 270, and the second conductive pattern CP2 of the second connecting layer 250. In some exemplary embodiments, resistance of the second data transfer line TL2 may be less than that of the first data transfer line TL1.

In the semiconductor package 1000 according to an exemplary embodiment, the buffer chip 310 may be disposed inside the logic sub-package LP rather than the memory sub-package MP. Thus, any memory sub-package MP satisfying an existing joint electron device engineering council (JEDEC) standard may be adopted as the memory sub-package MP. Accordingly, there is no need to develop a new memory chip structure, and the semiconductor package 1000 according to an embodiment may be economical because it may adopt one of the memory sub-packages MPs of various manufacturers. In addition, when the buffer chip 310 is disposed inside the logic sub-package LP rather than the memory sub-package MP, a length of the second data transfer line TL2 may be relatively short. Since the second data transfer rate DTR2 of the second data transfer line TL2 between the controller chip 210 and the buffer chip 310 is greater than the first data transfer rate DTR1 of the first data transfer line TL1 between the plurality of memory chips 110 and the buffer chip 310, there may be a possibility that a signal integrity is deteriorated due to a high speed of the second data transfer line TL2. However, when the length of the second data transfer line TL2 is relatively short, the resistance of the second data transfer line TL2 decreases, so that the signal integrity of the semiconductor package 1000 according to an embodiment is improved.

When the buffer chip 310 is disposed above the third connecting layer 350 as illustrated in FIG. 2, the buffer chip 310 may be incorporated into the logic sub-package LP without increasing a planar area of the logic sub-package LP. In addition, since the first data transfer line TL1 does not extend into the second connecting layer 250, a sufficient space may be secured to form the second conductive patterns CP2 in the second connecting layer 250 connecting the external connecting pins 280 of the controller chip 210 to the external connecting member 500 and the second conductive patterns CP2 constituting a portion of the second data transfer line TL2. However, as described below with reference to FIGS. 3 and 4, a position of the buffer chip 310 in the logic sub-package LP may be variously modified.

Figure 3:
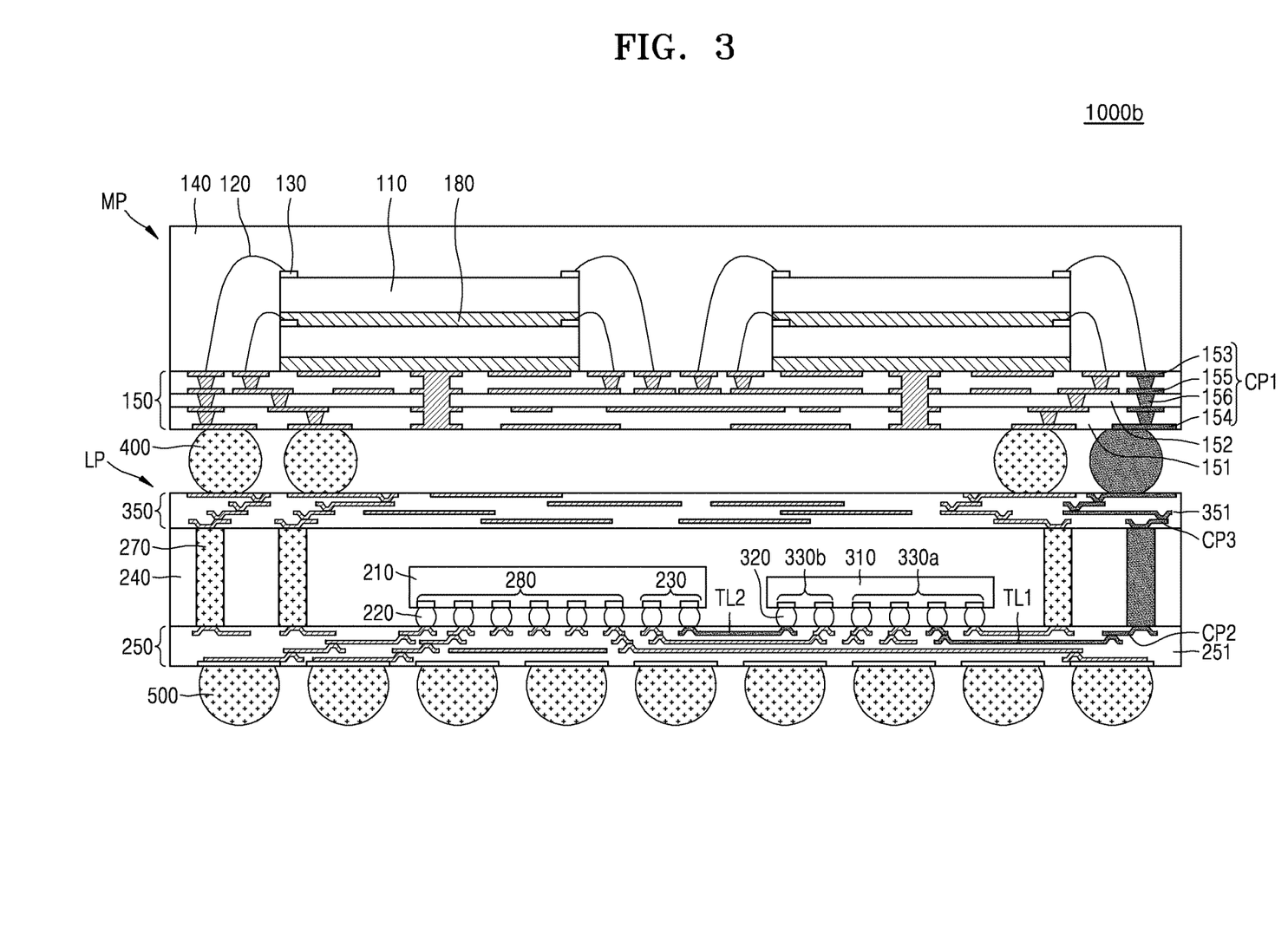
FIG. 3 is a cross-sectional view illustrating a semiconductor package according to an exemplary embodiment.

FIG. 3 is a cross-sectional view illustrating a semiconductor package 1000b according to an exemplary embodiment. Hereinafter, the semiconductor package 1000b according to the exemplary embodiment illustrated in FIG. 3 is described, focusing on differences from the semiconductor package 1000 according to the embodiment illustrated in FIG. 2.

Referring to FIG. 3, the buffer chip 310 of the semiconductor package 1000b according to an exemplary embodiment may be disposed on the top surface of the second connecting layer 250. In other words, the buffer chip 310 and the controller chip 210 may be disposed side by side on the top surface of the second connecting layer 250. In this case, the first data transfer line TL1 may include the first conductive pattern CP1 of the first connecting layer 150, the inter-package connecting member 400, the third conductive pattern CP3 of the third connecting layer 350, the inter-layer connecting member 270, and the second conductive pattern CP2 of the second connecting layer 250. The second data transfer line TL2 may include the second conductive pattern CP2 of the second connecting layer 250. When the buffer chip 310 is disposed on the top surface of the second connecting layer 250, the length of the second data transfer line TL2 having a high speed between the buffer chip 310 and the controller chip 210 may become relatively short. Accordingly, the signal integrity of the semiconductor package 1000b may be improved.

According to an exemplary embodiment, unlike as illustrated in FIG. 3, the logic sub-package LP may not include the third connecting layer 350, and the inter-package connecting member 400 may be formed to contact the inter-layer connecting member 270. In such embodiment, the first data transfer line TL1 may include the first conductive pattern CP1 of the first connecting layer 150, the inter-package connecting member 400, the inter-layer connecting member 270, and the second conductive pattern CP2 of the second connecting layer 250.

According to another exemplary embodiment, the logic sub-package LP may not include the inter-layer connecting member 270 as well as the third connecting layer 350, and the inter-package connecting member 400 may be formed to contact the second connecting layer 250. In such embodiment, the first data transfer line TL1 may include the first conductive pattern CP1 of the first connecting layer 150, the inter-package connecting member 400, and the second conductive pattern CP2 of the second connecting layer 250.

Figure 4:
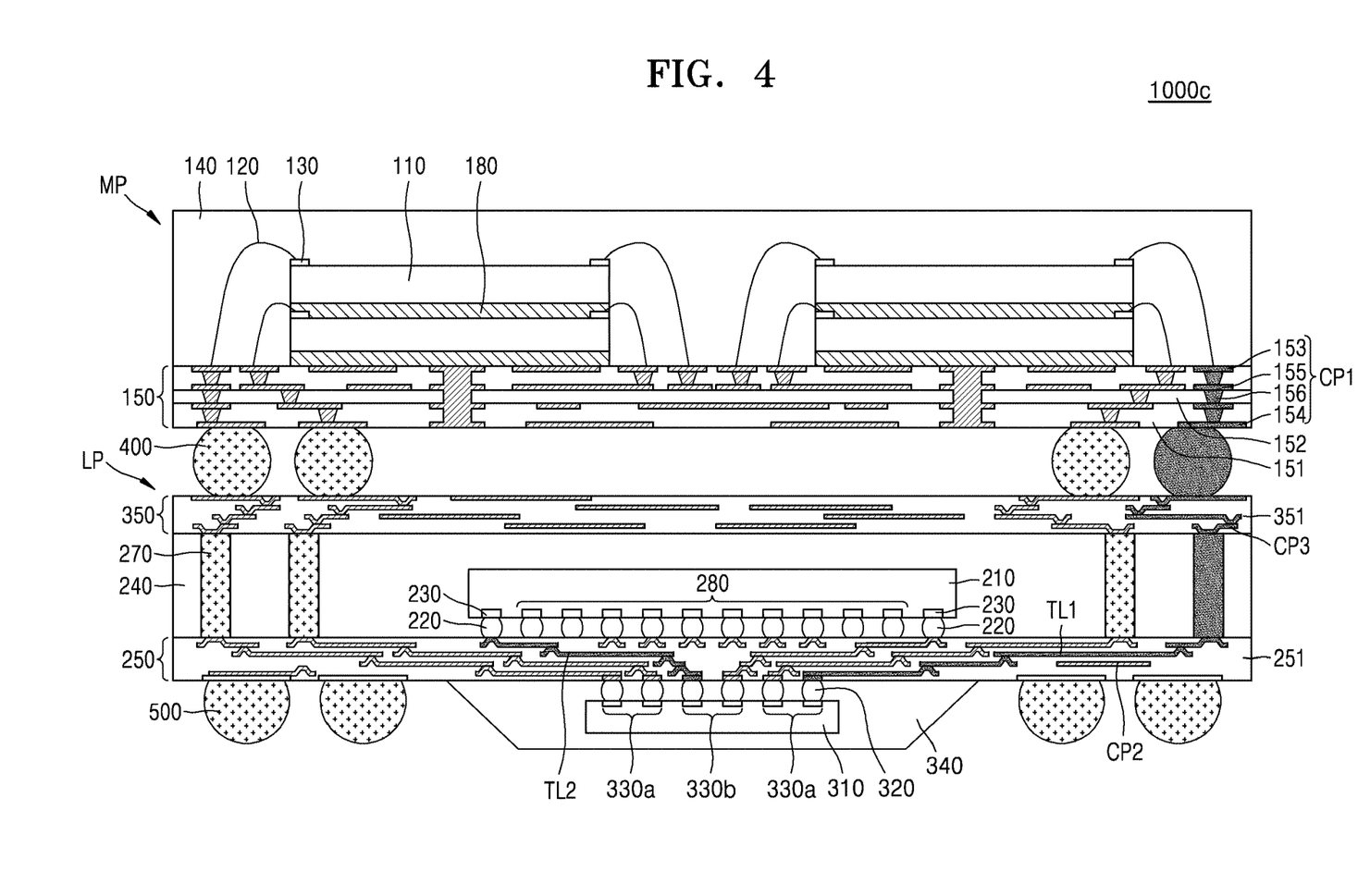
FIG. 4 is a cross-sectional view illustrating a semiconductor package according to an exemplary embodiment.

FIG. 4 is a cross-sectional view illustrating a semiconductor package 1000c according to an exemplary embodiment. Hereinafter, the semiconductor package 1000c according to the exemplary embodiment illustrated in FIG. 4 is described, focusing on differences from the semiconductor package 1000b according to the embodiment illustrated in FIG. 3.

Referring to FIG. 4, the buffer chip 310 may be disposed on the bottom surface of the second connecting layer 250. In other words, the buffer chip 310 and the controller chip 210 may be respectively disposed on mutually opposite surfaces of the second connecting layer 250, respectively. When the buffer chip 310 is disposed on the bottom surface of the second connecting layer 250, the length of the second data transfer line TL2 having a high speed between the buffer chip 310 and the controller chip 210 may become relatively short. Accordingly, the signal integrity of the semiconductor package 1000c may be improved. In addition, the buffer chip 310 may be incorporated into the logic sub-package LP without increasing the planar area of the logic sub-package LP.

Figure 5:
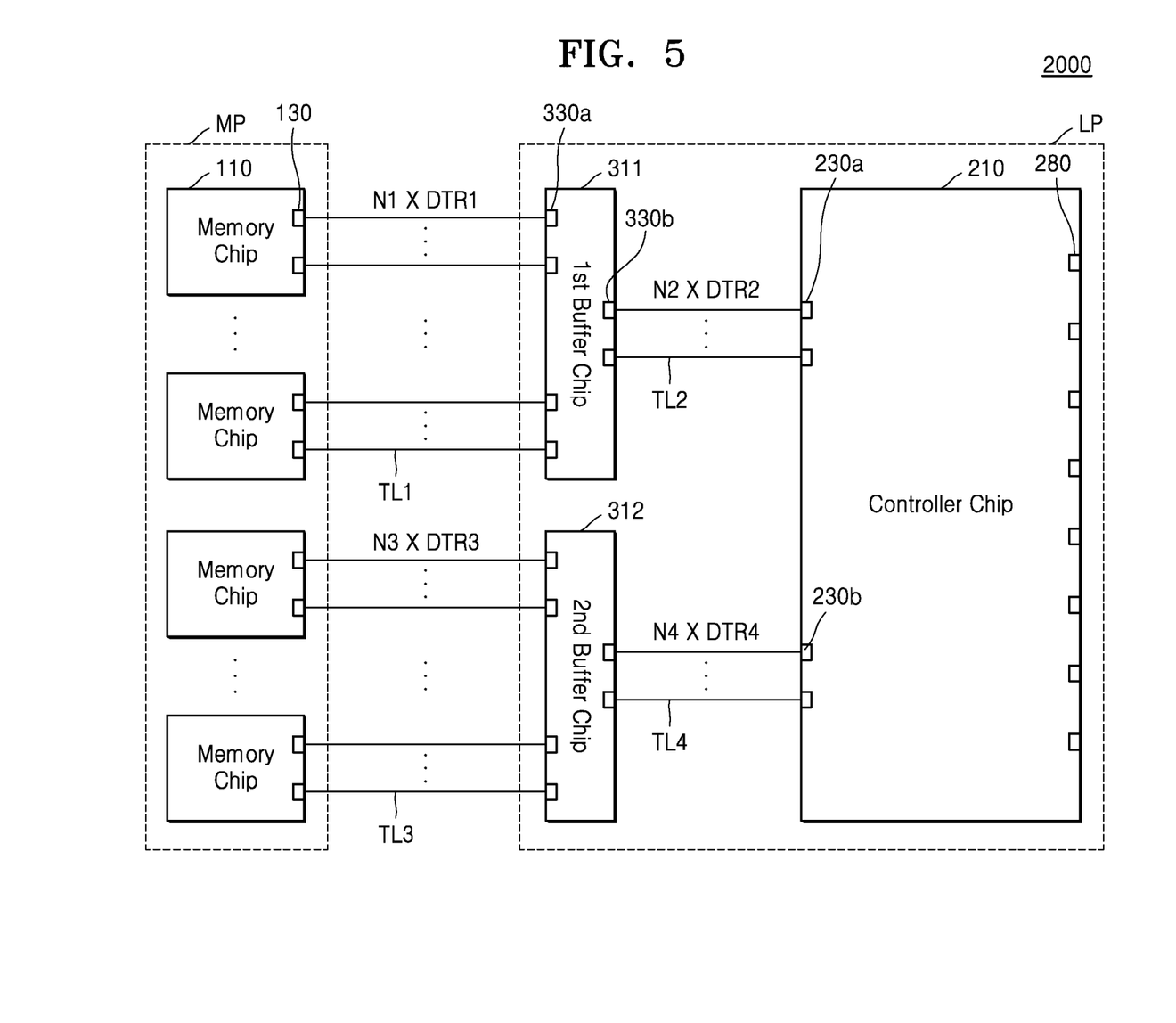
FIG. 5 is a block diagram illustrating a semiconductor package according to an exemplary embodiment.

FIG. 5 is a block diagram illustrating a semiconductor package 2000 according to an exemplary embodiment. Hereinafter, the semiconductor package 2000 according to the exemplary embodiment illustrated in FIG. 5 is described, focusing on differences from the semiconductor package 1000 according to the embodiment illustrated in FIG. 1.

Referring to FIG. 5, the semiconductor package 2000 according to an exemplary embodiment may include a plurality of buffer chips. For example, the semiconductor package 2000 may include a first buffer chip 311 and a second buffer chip 312. However, the number of the buffer chips included in the semiconductor package 2000 is not limited thereto, and for example, may be more than two. The first buffer chip 311 and the second buffer chip 312 may be connected to the memory sub-package MP and the controller chip 210. The plurality of first data transfer lines TL1 each having the first data transfer rate DTR1 may connect the first buffer chip 311 and the memory sub-package MP. The plurality of second data transfer lines TL2 each having the second data transfer rate DTR2 may connect the first buffer chip 311 and the controller chip 210. A plurality of third data transfer lines TL3 each having a third data transfer rate DTR3 may connect the second buffer chip 312 and the memory sub-package MP. A plurality of fourth data transfer lines TL4 each having a fourth data transfer rate DTR4 may connect the second buffer chip 312 and the controller chip 210.

Each of the memory chips 110 may be connected to the first buffer chip 311 or the second buffer chip 312. In other words, each of the memory chips 110 may be connected to at least one first data transfer line TL1 and/or at least one third data transfer line TL3. In FIG. 5, an embodiment is illustrated in which some memory chips 110 are connected only to the first buffer chip 311, and the remaining of the memory chips 110 are connected only to the second buffer chip 312. In other words, all of the data transfer pins 130 of the some memory chips 110 are connected only to the first data transfer lines TL1, and all of the data transfer pins 130 of the remaining memory chips 110 are connected only to the third data transfer lines TL3. However, a connecting relationship between the plurality of memory chips 110, and the first buffer chip 311 and the second buffer chip 312 may be variously modified. For example, each memory chip 110 may be connected to both the first buffer chip 311 and the second buffer chip 312. In other words, some of the data transfer pins 130 of each memory chip 110 may be connected to the first data transfer lines TL1 and the remaining of the data transfer pins 130 of each memory chip 110 may be connected to the third data transfer lines TL3.

In some exemplary embodiments, the first buffer chip 311 and the second buffer chip 312 may be substantially identical chips having substantially identical circuitry and structure. In other words, the first data transfer rate DTR1 and the third data transfer rate DTR3 may be substantially identical to each other, and the second data transfer rate DTR2 and the fourth data transfer rate DTR4 may be substantially identical to each other. In addition, the number N1 of the first data transfer lines TL1 and the number N3 of the third data transfer lines TL3 may be the same, and the number N2 of the second data transfer lines TL2 and the number N4 of the transmission lines TL4 may be the same.

Figure 6:
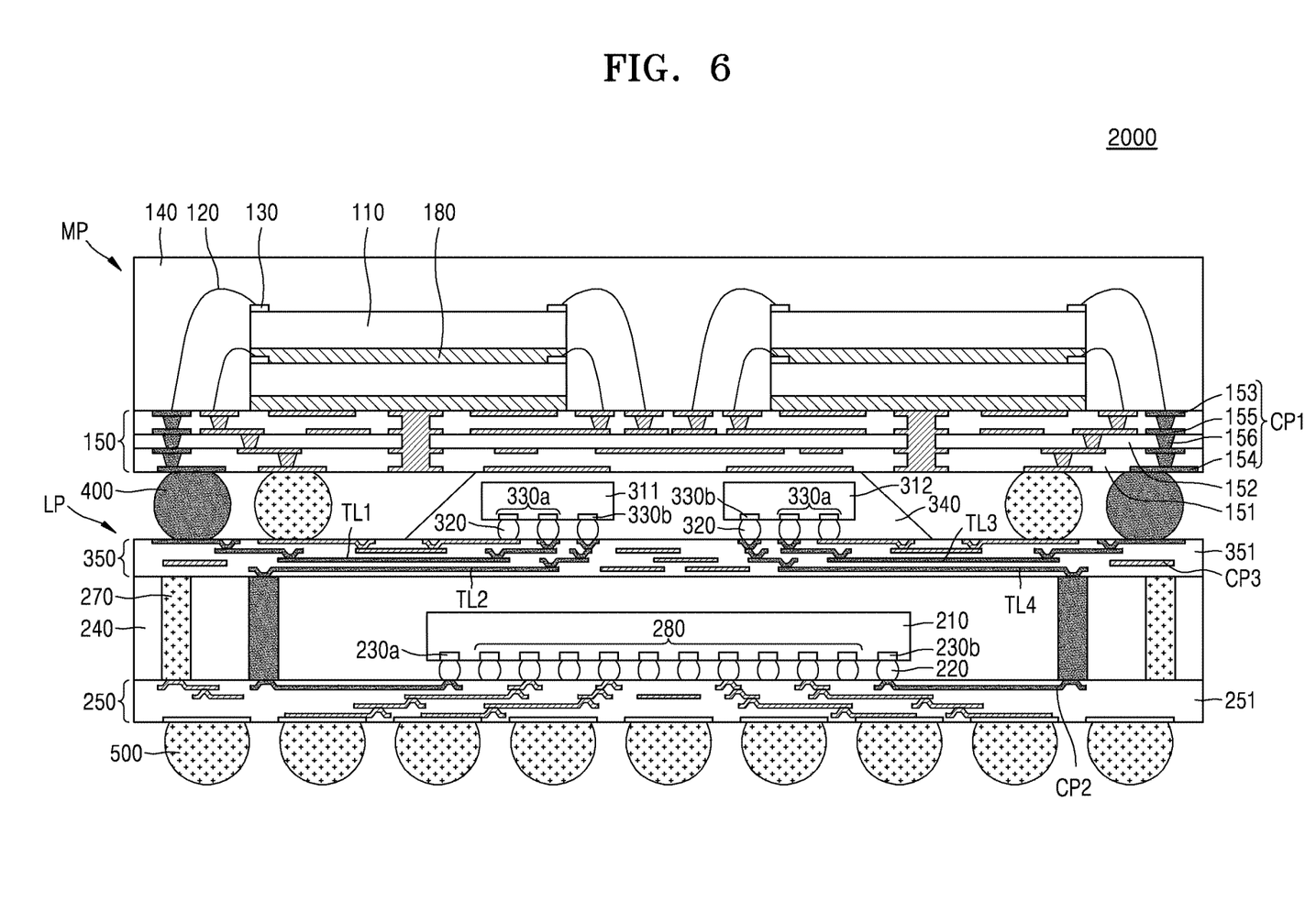
FIG. 6 is a cross-sectional view illustrating a semiconductor package illustrated in FIG. 5, according to an exemplary embodiment.

FIG. 6 is a cross-sectional view illustrating the semiconductor package 2000 illustrated in FIG. 5 according to an exemplary embodiment. Hereinafter, the semiconductor package 2000 according to the exemplary embodiment illustrated in FIG. 6 is described, focusing on differences from the semiconductor package 1000 according to the embodiment illustrated in FIG. 2.

Referring to FIG. 6, the first buffer chip 311 and the second buffer chip 312 may be spaced apart from each other. In some exemplary embodiments, the first buffer chip 311 and the second buffer chip 312 may be disposed on the top surface of the third connecting layer 350. Each of the first data transfer line TL1 and the third data transfer line TL3 may include the first conductive pattern CP1 of the first connecting layer 150, the inter-package connecting member 400, and the third conductive pattern CP3 of the third connecting layer 350. Each of the second data transfer line TL2 and the fourth data transfer line TL4 may include the third conductive pattern CP3 of the third connecting layer 350, the inter-layer connecting member 270, and the second conductive pattern CP2 of the second connecting layer 250.

The controller chip 210 may include at least one first data transfer pin 230a connected to the first buffer chip 311 via the second data transfer line TL2, at least one second data transfer pin 230b connected to the second buffer chip 312 via the fourth data transfer line TL4, and the external connecting pins 280 connected to the external connecting members 500. In some exemplary embodiments, at least one first data transfer pin 230a and at least one second data transfer pin 230b may be spaced apart by the external connecting pins 280. In this case, to reduce the length of the second data transfer line TL2 and the length of the fourth data transfer line TL4, the first buffer chip 311 may be connected relatively closer to the first data transfer pin 230a of the controller chip 210, and the second buffer chip 312 may be disposed relatively closer to the second data transfer pin 230b of the controller chip 210.

Furthermore, positions of the first buffer chip 311 and the second buffer chip 312 may be variously modified in the logic sub-package LP. For example, each of the first buffer chip 311 and the second buffer chip 312 may be disposed on the top surface of the third connecting layer 350, on the top surface of the second connecting layer 250, or on the bottom surface of the second connecting layer 250. It may also be possible that the first buffer chip 311 is disposed on the third connecting layer 350 and the second buffer chip 312 is on the bottom surface of the second connecting layer 250. At least one of the length of the first data transfer line TL1, the length of the second data transfer line TL2, a length of the third data transfer line TL3, and the length of the fourth data transfer line TL4 may be reduced by optimizing the positions of the first buffer chip 311 and the second buffer chip 312. Accordingly, the signal integrity of the semiconductor package 2000 may be improved.

The embodiments disclosed in the present inventive concept are not intended to limit the scope of the present inventive concept but intended to describe the technical ideas of the present inventive concept, and the scope of the technical ideas of the present inventive concept is not limited by these embodiments. The scope of protection of the present inventive concept should be construed according to the following claims, and all technical ideas which are within the scope of the same should be interpreted as being included in the scope of the present inventive concept.

What is claimed is:

1. A semiconductor package comprising:
a memory sub-package comprising a first connecting layer and a plurality of memory chips disposed on the first connecting layer;
a logic sub-package comprising a second connecting layer, a controller chip disposed on the second connecting layer, and a buffer chip connected to the controller chip and the plurality of memory chips; and
a plurality of inter-package connecting members each of which connects the memory sub-package and the logic sub-package,
wherein the buffer chip comprises a plurality of first data transmission pins connected to the memory sub-package via a plurality of first data transfer lines and a plurality of second data transmission pins connected to the controller chip via a plurality of second data transfer lines, and the number of the plurality of first data transmission pins is greater than the number of the plurality of second data transmission pins.

2. The semiconductor package of claim 1, wherein a data transfer rate of each of the plurality of first data transfer pins is less than a data transfer rate of each of the plurality of second data transmission pins.

3. The semiconductor package of claim 1, wherein the number of the plurality of first data transmission pins is an even multiple of the number of the plurality of second data transmission pins.

4. The semiconductor package of claim 1, wherein a product of the number of the plurality of first data transmission pins and a data transfer rate of each of the plurality of first data transmission pins is substantially identical to a product of the number of the plurality of second data transmission pins and a data transfer rate of each of the plurality of second data transmission pins.

5. The semiconductor package of claim 1, wherein resistance of each of the plurality of first data transfer lines is greater than resistance of each of the plurality of second data transfer lines.

6. The semiconductor package of claim 1, wherein the buffer chip comprises a serial-parallel conversion circuit.

7. The semiconductor package of claim 1, wherein the buffer chip is spaced apart from the first connecting layer.

8. The semiconductor package of claim 1, wherein the logic sub-package is of a fan-out type.

9. The semiconductor package of claim 1, wherein the logic sub-package further comprises a third connecting layer disposed above the controller chip, and a plurality of inter-layer connecting members each extending between the third connecting layer and the second connecting layer.

10. The semiconductor package of claim 9, wherein the buffer chip is disposed on the third connecting layer.

11. The semiconductor package of claim 1, wherein the buffer chip is disposed side by side with the controller chip on a top surface of the second connecting layer.

12. The semiconductor package of claim 1, wherein the buffer chip is disposed on a bottom surface of the second connecting layer.

13. A semiconductor package comprising:
a memory sub-package, the memory sub-package comprising:
a first connecting layer comprising a first insulating layer and a plurality of first conductive patterns; and
a plurality of memory chips on the first connecting layer,
a logic sub-package below the memory sub-package, the logic sub-package comprising:
a second connecting layer comprising a second insulating layer and a plurality of second conductive patterns;
a controller chip on the second connecting layer;
a third connecting layer disposed above the controller chip, the third connecting layer comprising a third insulating layer and a plurality of third conductive patterns;
a plurality of inter-layer connecting members each of which extends between the third connecting layer and the second connecting layer; and
a buffer chip on the third connecting layer, and
a plurality of inter-package connection members between the memory sub-package and the logic sub-package, the plurality of inter-package connecting members connects between third connecting layer and the first connecting layer;
wherein the buffer chip is connected to the plurality of memory chips via a plurality of first data transfer lines each having a first data transfer rate, the buffer chip is connected to the controller chip via a plurality of second data transfer lines each having a second data transfer rate, and the first data transfer rate is less than the second data transfer rate.

14. The semiconductor package of claim 13, wherein each of the plurality of first data transfer lines comprises at least one of the plurality of first conductive patterns, one of the plurality of inter-package connecting members, and at least one of the plurality of third conductive patterns.

15. The semiconductor package of claim 13, wherein the plurality of first data transfer lines comprise none of the plurality of second conductive patterns.

16. The semiconductor package of claim 13, wherein each of the plurality of second data transfer lines comprises at least one of the plurality of third conductive patterns, one of the plurality of inter-layer connecting members, and at least one of the plurality of second conductive patterns.

17. A semiconductor package comprising:
a memory sub-package comprising a first connecting layer and a plurality of DRAM chips disposed on the first connecting layer;
a logic sub-package comprising a second connecting layer, a controller chip on the second connecting layer, and a first logic buffer chip connected to the memory sub-package and the controller chip; and
a plurality of inter-package connecting members each of which connects the memory sub-package and the logic sub-package,
wherein the first logic buffer chip comprises a plurality of first data transmission pins connected to the memory sub-package and a plurality of second data transmission pins connected to the controller chip, and the number of the plurality of first data transmission pins is greater than the number of the plurality of second data transmission pins.

18. The semiconductor package of claim 17, wherein the logic sub-package further comprises a second logic buffer chip connected to the memory sub-package and the controller chip, and
wherein the second logic buffer chip comprises a plurality of third data transmission pins connected to the memory sub-package and a plurality of fourth data transmission pins connected to the controller chip, and the number of the plurality of third data transmission pins is greater than the number of the plurality of fourth data transmission pins.

19. The semiconductor package of claim 18, wherein the number of the first data transmission pins is equal to the number of the third data transmission pins, and the number of the second data transmission pins is equal to the number of the fourth data transmission pins.

20. The semiconductor package of claim 18, wherein the logic sub-package further comprises a third connecting layer disposed above the controller chip, and a plurality of interlayer connecting members each extending between the third connecting layer and the second connecting layer, and
   wherein both the first logic buffer chip and the second logic buffer chip are located on the third connecting layer.

* * * * *